(12) United States Patent
Washburn

(10) Patent No.: US 6,593,825 B1
(45) Date of Patent: Jul. 15, 2003

(54) OSCILLATOR HAVING UNIDIRECTIONAL CURRENT FLOW BETWEEN RESONANT CIRCUIT AND ACTIVE DEVICES

(75) Inventor: Clyde Washburn, Victor, NY (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/947,740

(22) Filed: Sep. 6, 2001

(51) Int. Cl.[7] .................................................. H03B 5/12
(52) U.S. Cl. ........................... 331/117 FE; 331/177 R; 331/167
(58) Field of Search ...................... 331/177 V, 117 R, 331/117 FE, 177 R, 167, 132, 175, 114, 113 R

(56) References Cited

U.S. PATENT DOCUMENTS

| | | | |
|---|---|---|---|
| 4,628,284 A | * 12/1986 | Bruning et al. ............. 331/186 |
| 4,691,304 A | * 9/1987 | Hori et al. ................... 327/536 |
| 4,967,100 A | * 10/1990 | Okutsu et al. ............... 327/111 |
| 5,561,398 A | * 10/1996 | Rasmussen ........... 331/116 FE |
| 6,281,758 B1 | * 8/2001 | Elsayed et al. ........ 331/117 FE |
| 6,417,740 B1 | * 7/2002 | Anh et al. ..................... 331/48 |

* cited by examiner

*Primary Examiner*—Terry D. Cunningham
*Assistant Examiner*—Quan Tra
(74) *Attorney, Agent, or Firm*—Westman, Champlin & Kelly

(57) ABSTRACT

An oscillator provides output signals over a range of oscillating frequencies includes an resonant circuit, at least one active circuit device operatively coupled to the resonant circuit to supply energy to the resonant circuit, and at least one unidirectional device coupled to the active circuit device. The unidirectional device permits current to flow between the active circuit device and the resonant circuit when the active circuit device adds energy to the resonant circuit, and impedes a drain of energy from the resonant circuit due to increased output signal amplitude.

23 Claims, 1 Drawing Sheet

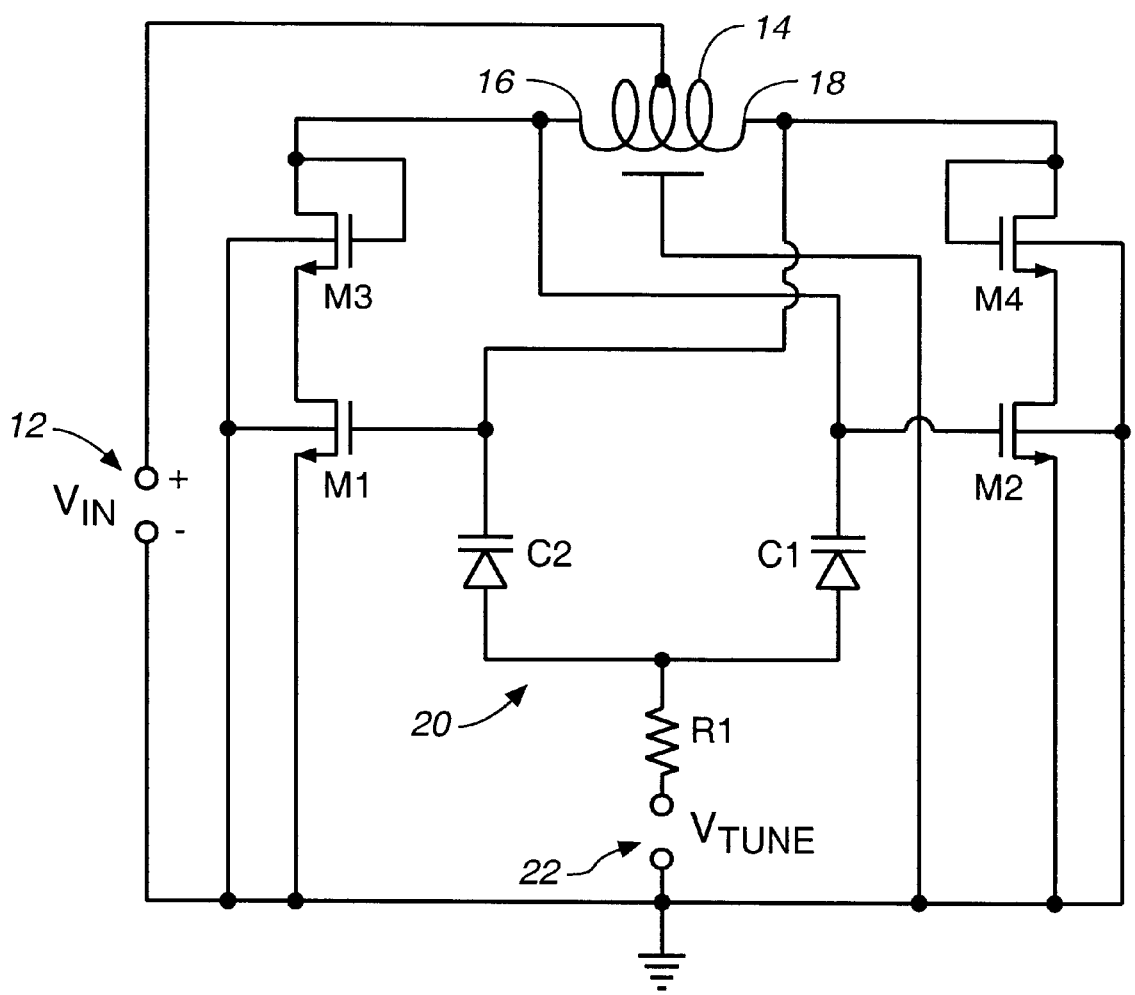
FIG._1

OSCILLATOR HAVING UNIDIRECTIONAL CURRENT FLOW BETWEEN RESONANT CIRCUIT AND ACTIVE DEVICES

FIELD OF THE INVENTION

This invention relates to reduction of Q loss in oscillators, and particularly to reduction of Q loss in wideband voltage controlled oscillators (VCOs).

BACKGROUND OF THE INVENTION

Voltage controlled oscillators (VCOs) employ a resonant circuit excited by active devices. The resonant circuit often employs an inductor and variable capacitor, coupled in a resonant LC relation. Adjustment of the variable capacitor alters the LC resonant frequency, and hence the frequency of the oscillator. Wideband VCOs (those tuning ¼ octave or more) exhibit a significant change in the resonant impedance of the LC circuit due to the changing quality factor, or Q, of the inductor with frequency and/or the changing Q of the capacitor with frequency and applied voltage.

In the design of VCOs employing bipolar, metal oxide (MOS) and gallium arsenide (GaAs) active devices, the loop gain is designed to ensure oscillation of acceptable magnitude under worst-case conditions. Under more favorable conditions, the oscillation may be so robust that the active device effectively saturates or "bottoms out" over an appreciable portion of the frequency cycle. When the active device bottoms out, it effectively shorts the resonant circuit to ground, reducing the Q of the resonant circuit (the ratio of reactance to loss resistance) and degrading the oscillator phase noise and jitter.

To overcome this problem, oscillators have been operated from current sources, rather than voltage sources. As a result, the average current through the oscillator is limited, and the oscillator voltage drops under more robust conditions. This technique maintains a higher Q, but it also decreases oscillation amplitude, resulting in degradation of phase noise and jitter by decreasing the ratio of the oscillation amplitude to the circuit noise sources.

The suitability of an oscillator for a given use is normally governed by the worst performance the oscillator may provide at any given frequency at which it is expected to operate. Even if an oscillator operates favorably under some conditions and/or frequency settings, the suitability of the oscillator is still measured by its worst-case performance. Consequently, there is a need to improve the worst-case performance of an oscillator to make the worst-case performance less different from better-case performance.

SUMMARY OF THE INVENTION

A circuit according to the present invention is arranged to provide output signals over a range of oscillating frequencies. The circuit includes a resonant circuit, at least one active circuit device operatively coupled to the resonant circuit to supply energy to the resonant circuit, and at least one unidirectional device coupled to the active circuit device. The unidirectional device permits current to flow between the active circuit device and the resonant circuit when the active circuit device adds energy to the resonant circuit and serves to impede draining energy from the resonant circuit due to increased output signal amplitude.

BRIEF DESCRIPTION OF THE DRAWINGS

The sole FIGURE is a circuit diagram of a voltage controlled oscillator according to one embodiment of the present invention.

DETAILED DESCRIPTION OF THE PREFERRED EMBODIMENTS

The FIGURE illustrates a single-ended wideband voltage controlled oscillator (VCO) 10 having a power supply 12 supplying power to the center tap of coil 14. In preferred embodiments, oscillator 10 is fabricated in an integrated circuit by well-known IC fabrication processes. Active N-channel MOSFET devices M1 and M2 are coupled through diode-connected N-channel MOSFET devices M3 and M4, respectively, to opposite ends 16 and 18 of coil 14. End 16 of coil 14 is coupled to one side of variable capacitor C1, and to the control electrode (gate) of MOSFET M2. Similarly, end 18 of coil 14 is coupled to one side of variable capacitor C2, and to the control electrode (gate) of MOSFET M1. The opposite ends of capacitors C1 and C2 are coupled together, and through resistor R1 to a tuning voltage source 22, which in turn is coupled to a common potential, such as electrical ground. In preferred embodiments, capacitors C1 and C2 are varicaps, which may be junction diodes whose insulating barriers widen with increasing reverse voltage to change the capacitance between the anode and cathode terminals of the diode, or MOS devices that exhibit a voltage-dependent capacitance between the gate and channel.

MOSFETs M3 and M4 are diode-connected such that their drain electrodes are coupled to their gate electrodes and to the respective ends 16 and 18 of coil 14. Active MOSFET M1 has its drain electrode coupled to the source electrode of MOSFET M3, its gate electrode coupled to the drain electrode of MOSFET M4 and to end 18 of coil 14, and its source electrode coupled to ground. Similarly, active MOSFET M2 has its drain electrode coupled to the source electrode of MOSFET M4, its gate electrode coupled to the drain electrode of MOSFET M3 and to end 16 of coil 14, and its source electrode coupled to ground. The body or substrate of each MOSFET M1, M2, M3 and M4 is coupled to electrical ground, and the body or core of coil 14 is coupled to electrical ground.

In operation, the voltage from supply 12 operates the active MOSFETs M1 and M2 and the resonant circuit 20 formed by coil 14 and varicaps C1 and C2. The capacitance of varicaps C1 and C2, and hence the resonant frequency of circuit 20, is established by the tuning the bias voltage source 22 to the varicaps through resistor R1.

The diode-connected MOSFETs M3 and M4 prevent the active MOSFETs from shorting the resonant circuit. More particularly, during normal operation, the resonance of series capacitors C1 and C2 with the inductor of coil 14 causes a circulating current to flow at the resonant frequency. The transfer of charge due to the circulating current reverses the conductive states of MOSFETs M1 and M2. The circuit oscillates at the frequency established by parameters of resonant circuit 20. If the oscillation amplitude becomes too great, a risk exists that one or both of MOSFETs M1 and M2 become saturated (bottoms out) during a portion of the frequency cycle. If this occurs, the saturated MOSFET will try to hold the coil potential at that end constant, shunting to ground the circulating current that would otherwise flow between the capacitor and inductor. Thus, without diode-connected MOSFETs M3 and M4, MOSFETs M1 and M2 might remove energy from the resonant circuit thereby reducing its Q. Should this occur, the slope of the resonant circuit phase verses frequency curve is reduced, resulting in a reduced ability to maintain a steady frequency in the presence of noise sources. The inclusion of diode-connected MOSFETs M3 and M4, or such other diode devices that the fabrication process may allow to be constructed, prevents current flow that might reduce energy in the resonant circuit, thereby maintaining the resonant circuit phase slope at its small-signal value.

The phase noise spectrum decreases with frequency separation from the carrier frequency at about −6 to −9 dB/octave with a noise floor asymptote that differs from the carrier frequency by an amount approximately equal to the frequency of oscillation divided by twice the resonant.circuit Q. Hence, the distance of the noise floor asymptote from the carrier frequency varies inversely with the Q. With unidirectional devices, such as MOSFETs M3 and M4, the Q is increased, thereby reducing the distance of the noise floor asymptote from the carrier and proportionately lowering the noise level at lesser offsets. Hence, the oscillator with the unidirectional devices exhibits a lower phase noise level at any given offset within the resonant circuit half-bandwidth. Consequently, the "worst case" performance of the oscillator (which would occur when the oscillation is most robust) is improved.

The present invention employs uni-directional devices in series with the normal current flow of the active device to allow normal flow of current when the active device adds energy to the resonant circuit and to inhibit a drain of energy from the resonant circuit as oscillation amplitude grows. While the embodiment described herein employs diode-connected MOSFETs, any type of uni-directional, or current directional, device may be employed, including diodes, Schottky diodes, and low-threshold devices. Moreover, while the embodiment described herein is a balanced circuit, the invention is equally applicable to single-ended circuits as well. Nor is the invention limited to any particular type of semiconductor technology, as the invention might be implemented in P-channel, complementary or bi-polar devices. Moreover, the specific oscillator design is not limiting on the invention, so center-tapped coil 14, as a source of voltage, might be eliminated with some other supply arrangement, as in the case of complementary MOS.

Although the present invention has been described with reference to preferred embodiments, workers skilled in the art will recognize that changes may be made in form and detail without departing from the spirit and scope of the invention.

What is claimed is:

1. A circuit comprising:
   a variable frequency resonant circuit;
   an active circuit operatively coupled to the resonant circuit to supply energy to the resonant circuit; and
   unidirectional means coupled to the active circuit for adding energy to the resonant circuit and for impeding a drain of energy from the resonant circuit.

2. The circuit of claim 1, wherein the unidirectional means comprises at least one current directional device that permits current flow between the active circuit and the resonant circuit when the active circuit adds energy to the resonant circuit and impedes a drain of energy from the resonant circuit due to an increase in resonant circuit signal amplitude.

3. The circuit of claim 2, wherein the unidirectional device is a diode-connected active element.

4. The circuit of claim 2, wherein the unidirectional device is a MOSFET having drain and gate electrodes coupled together.

5. The circuit of claim 2, wherein resonant circuit is arranged to operate over a range of frequencies of at least one-quarter octave.

6. The circuit of claim 1, wherein the active circuit comprises at least one active device, and the unidirectional means comprises at least one current directional device coupled to the active circuit device to allow current flow between the active circuit device and the resonant circuit when the active circuit device supplies energy to the resonant circuit and to impede current flow between the active circuit device when the active circuit device does not supply energy to the resonant circuit.

7. The circuit of claim 6, wherein the unidirectional device is a diode-connected active element.

8. The circuit of claim 6, wherein resonant circuit is arranged to operate over a range of frequencies of at least one-quarter octave.

9. The circuit of claim 1, wherein the resonant circuit comprises:
   a coil having first and second opposite ends,
   a first variable capacitor having a first end coupled to the first end of the coil, and
   a second variable capacitor having a first end coupled to the second end of the coil, the first and second variable capacitors having second ends coupled together.

10. The circuit of claim 9, wherein the first capacitor is a first varicap and the second capacitor is a second vericap, the circuit further including:
    a source of tuning voltage coupled to the second ends of the first and second varicaps to adjust capacitance of the first and second vericaps.

11. The circuit of claim 10, wherein the unidirectional means comprises:
    a first unidirectional current device having first and second electrodes, the first electrode coupled to the first end of the coil, and
    a second unidirectional current device having first and second electrodes, the first electrode coupled to the second end of the coil,
    and the active circuit comprises:
    a first active device having a control electrode coupled to the second end of the coil, a first controlled electrode coupled to the second electrode of the first unidirectional current device and a second controlled electrode coupled to the second electrodes of the first and second varicaps, and
    a second active device having a control electrode coupled to the first end of the coil, a first controlled electrode coupled to the second electrode of the second unidirectional current device and a second controlled electrode coupled to the second electrodes of the first and second varicaps,
    the first unidirectional device being arranged relative to the first active device to prevent the first active device from draining energy from the first varicap during a saturated condition of the first active device, and the second unidirectional device being arranged relative to the second active device to prevent the second active device from draining energy from the second varicap during a saturated condition of the second active device.

12. The circuit of claim 1, wherein the active circuit comprises:
    a first active device coupled to the resonant circuit to supply energy to the resonant circuit during a first portion of a frequency cycle,
    a second active device coupled to the resonant circuit to supply energy to the resonant circuit during a second portion of a frequency cycle, and wherein the unidirectional means comprises:
  a first current directional device coupled to the first active device to permit current flow between the first active circuit device and the resonant circuit when the first active circuit device supplies energy to the resonant circuit and to impede current flow between the first active device and the resonant circuit which removes energy from the resonant circuit, and
  a second current directional device coupled to the second active device to permit current flow between the second active circuit device and the resonant circuit when the second active circuit device supplies energy to the resonant circuit and to impede current flow between the second active device and the resonant circuit which removes energy from the resonant circuit.

13. The circuit of claim 12, wherein the first and second current directional devices are diode-connected active elements.

14. The circuit of claim 12, wherein the range of frequencies is at least one-quarter octave.

15. An integrated circuit including an oscillator comprising:
  an input having at least one active terminal and a common terminal for coupling to a voltage source;
  a first diode-connected circuit device having a first electrode coupled to the active terminal, and a second electrode;
  a second diode-connected circuit device having a first electrode coupled to the active terminal, and a second electrode;
  a first active circuit device having a first controlled electrode coupled to the second electrode of the first diode-connected device, a control electrode coupled to the first electrode of the second diode-connected device, and a second controlled electrode for connection to the common terminal;
  a second active circuit device having a first controlled electrode coupled to the second electrode of the second diode-connected device, a control electrode coupled to the first electrode of the first diode-connected device, and a second controlled electrode for connection to the common terminal;
  a coil having its ends coupled to respective ones of the first electrodes of the first and second diode-connected devices;
  a first variable capacitor having a first end coupled to the control electrode of the first active device and a second end coupled to the common terminal; and
  a second variable capacitor having a first end coupled to the control electrode of the second active device and a second end coupled to the second end of the first variable capacitor.

16. The integrated circuit of claim 15, wherein the first and second capacitors are varicaps.

17. The integrated circuit of claim 15, wherein the coil has a center tap coupled to the active terminal of the input.

18. The oscillator of claim 15, wherein each of the first and second active devices and first and second diode-connected devices includes a body coupled to the common terminal.

19. The oscillator of claim 15 having an operating range of at least one-quarter octave.

20. A process of operating an oscillator containing an active circuit element and a variable frequency resonant circuit comprising steps of:
  a) operating the resonant circuit to oscillation through the active circuit; and
  b) impeding drain of energy from the resonant circuit due to saturation of the active circuit element.

21. The process of claim 20, wherein step (b) includes:
  operating the active circuit element so that current flows through the active circuit element in only one direction.

22. The process of claim 20, wherein the resonant circuit includes first and second variable capacitors coupled in series and a coil coupled in parallel to the series-coupled first and second capacitors, the process further including:
  c) adjusting capacitance values of the first and second capacitors to select a frequency of the resonant circuit.

23. A circuit comprising:
  a variable frequency resonant circuit;
  an active circuit operatively coupled to the resonant circuit to supply energy to the resonant circuit; and
  a unidirectional device coupled to the active circuit to add energy to the resonant circuit and impede a drain of energy from the resonant circuit.

* * * * *